United States Patent
Dankert et al.

(10) Patent No.: US 7,355,881 B1
(45) Date of Patent: Apr. 8, 2008

(54) MEMORY ARRAY WITH GLOBAL BITLINE DOMINO READ/WRITE SCHEME

(75) Inventors: Floyd L. Dankert, Austin, TX (US); Victor F. Andrade, Austin, TX (US); Randal L. Posey, Austin, TX (US); Michael K. Ciraula, Round Rock, TX (US); Alexander W. Schaefer, Austin, TX (US); Jerry D. Moench, Austin, TX (US); Soolin Kao Chrudimsky, Austin, TX (US); Michael C. Braganza, Austin, TX (US); Jan Michael Huber, Austin, TX (US); Amy M. Novak, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 78 days.

(21) Appl. No.: 11/285,670

(22) Filed: Nov. 22, 2005

(51) Int. Cl.
*G11C 11/00* (2006.01)
*G11C 7/10* (2006.01)
*G11C 7/00* (2006.01)

(52) U.S. Cl. .................. 365/156; 365/154; 365/189.02; 365/202

(58) Field of Classification Search .............. 365/154, 365/156, 189.02, 202
See application file for complete search history.

(56) References Cited

U.S. PATENT DOCUMENTS

| | | | |
|---|---|---|---|
| 5,699,530 A * | 12/1997 | Rust et al. .................. 711/150 |
| 6,058,065 A | 5/2000 | Lattimore et al. | |
| 6,597,611 B2 | 7/2003 | Desai et al. | |
| 6,657,886 B1 | 12/2003 | Adams et al. | |
| 6,880,144 B2 | 4/2005 | Kumala | |
| 6,901,003 B2 | 5/2005 | Adams et al. | |
| 7,116,574 B2 * | 10/2006 | Sugahara et al. ........... 365/156 |
| 7,209,394 B1 * | 4/2007 | Dankert et al. ........ 365/189.02 |
| 2003/0006821 A1 * | 1/2003 | Rogenmoser et al. ....... 327/408 |
| 2006/0012399 A1 * | 1/2006 | Dhong et al. ............... 326/113 |
| 2006/0268599 A1 * | 11/2006 | Sugahara et al. ........... 365/156 |

OTHER PUBLICATIONS

"The Multi-Threaded, Parity Protected, 128 Word Register Files on a Dual-Core Itanium® Family Processor," Fetzer, et al, Proceedings of the IEEE International Solid-State Circuits Conference, Feb. 2005.

"A 32b 64-Word 9-Read-Port/7-Write-Port Pseudo Dual-Bank Register File Using Copied Memory Cells For A Multi-Threaded Processor", Sumita, et al; Solid-State Circuits Conference, 2005. Digest of Technical Papers. ISSCC. 2005 IEEE International; Date: Feb. 6-10, 2005, pp. 384-605 vol. 1.

"A 130-nm 6-GHz 256x32 bit Leakage-Tolerant Register File"; Krishnamurthy, et al; IEEE Journal of Solid-State Circuits, vol. 37, No. 5, May 2002.

* cited by examiner

*Primary Examiner*—Huan Hoang
*Assistant Examiner*—Lý Duy Pham
(74) *Attorney, Agent, or Firm*—Meyertons Hood Kivlin Kowert & Goetzel, P.C.; Erik A. Heter

(57) ABSTRACT

A circuit for implementing memory arrays using a global bitline domino read/write scheme. The memory circuit includes a plurality of cells each configured to store a bit of data. The memory circuit further includes a plurality of local bitlines, wherein each cells is coupled to one of the local bitlines. Each of the plurality of local bitlines is a differential bitline having a signal path and a complementary signal path which are cross-coupled by a pair of transistors.

10 Claims, 6 Drawing Sheets

WL

MEMORY ARRAY WITH GLOBAL BITLINE DOMINO READ/WRITE SCHEME

BACKGROUND OF THE INVENTION

1. Field of the Invention

This invention relates to electronic systems, and more particularly, circuitry for addressing memory devices in electronic systems.

2. Description of the Related Art

Memories such as cache memories include a plurality of cells arranged in an array. The cells may be connected to each other by bitlines and wordlines. One embodiment of an array of cells in a cache memory is shown in FIG. 1. As shown in the drawing, the cells are connected in rows by wordlines and connected in columns by pairs of bitlines. Each bitline of a plurality of cells may convey a signal that is a logical complement with respect to the signal carried on the other bitline of the pair (which may be referred to as an inverse bitline). Sense amplifiers may be coupled to the bitlines in order to amplify and transmit signals received therefrom.

With the advent of smaller feature sizes in current microprocessors (and other types of integrated circuits), the trend towards lower operating voltages, and the increases in operating speed (i.e. clock frequencies), the traditional arrangement shown above may not always be suitable. Variations in parameters such as temperature, voltage, or process may introduce biases into the bitlines (and corresponding Sense Amplifiers), wherein the sense amplifiers are more prone to read one logic value over another logic value. These biases, in the absence of compensation, may cause erroneous values to be read from the memory cells.

One solution to the problems described above is to use a plurality of local bitlines coupled to a global bitline (sometimes referred to as a 'domino' approach). FIG. 2 illustrates one embodiment of such an arrangement for a single bitline of a bitline pair. In the embodiment shown, a group of cells are connected to local bitline, which is in turn coupled to a global bitline. The plurality of bitlines may be coupled to the global bitline via a wired-OR approach, or as shown herein, via a sense amplifier. However, even this approach may suffer some of the same drawbacks as the previous approach with the aforementioned advent of smaller feature sizes, lower operating voltages, and increases in operating speed. Thus, these circuit designs may be inadequate for newer microprocessors or other circuits which implement memory circuits as shown in FIG. 1.

SUMMARY OF THE INVENTION

A circuit for implementing memory arrays using a global bitline domino read/write scheme is disclosed. In one embodiment, a memory circuit includes a plurality of cells each configured to store a bit of data. The memory circuit further includes a plurality of local bitlines, wherein each cell is coupled to one of the local bitlines. Each of the plurality of local bitlines is a differential bitline having a signal path and a complementary signal path, which are cross-coupled by a pair of transistors.

In various embodiments, the memory circuit may include one or more precharge lines operatively coupled to each of local bitlines. The precharge lines, when energized, cause the operatively coupled local bitlines to be pulled up to a logic high voltage. During a subsequent read cycle, when a cell is accessed, one of the associated local bitlines (either the signal path or complementary signal path) falls to a logic low voltage, while the other signal path of the differential local bitline remains at a logic high voltage. The transistors which cross-couple the signal path and complementary signal path of the differential local bitlines may ensure that the correct logic voltage value is held until the next precharge operation.

Various embodiments may also include pull circuits, which include transistors that are coupled to the local bitlines such that the pull circuit may pull up a local bitline to a logic high voltage or pull down a local bitline to a logic low voltage. The pull circuits may be energized accordingly during write operations in order to ensure the correct value is written in a target cell or cells.

The memory circuit may be part of a memory subsystem. The memory subsystem may include a control circuit, which provides signals for reading, writing, and precharging to the memory arrays. The control circuit may further control the sequence in which reading, writing, and precharging is performed, and may further control which of these operations are performed for a given memory cycle.

BRIEF DESCRIPTION OF THE DRAWINGS

Other aspects of the invention will become apparent upon reading the following detailed description and upon reference to the accompanying drawings in which;

FIG. 8 is a block diagram of one embodiment of a memory subsystem including a memory control circuit and a memory array.

Figure 1:
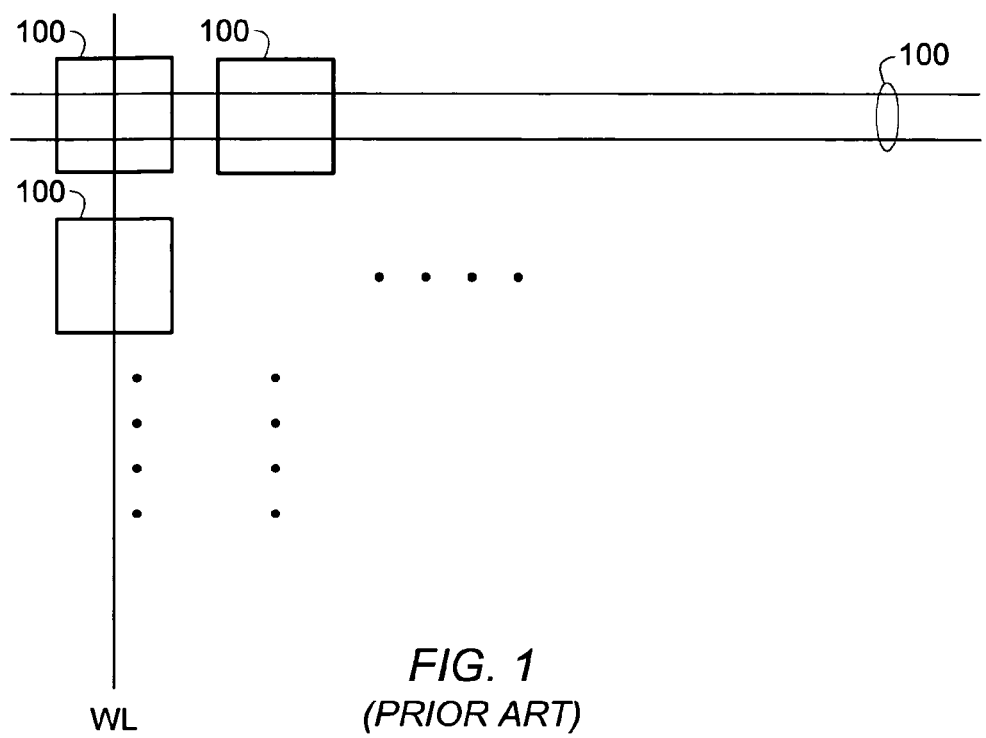
FIG. 1 (Prior Art) is an example of one embodiment of an array of cells in a cache memory.
Figure 2:
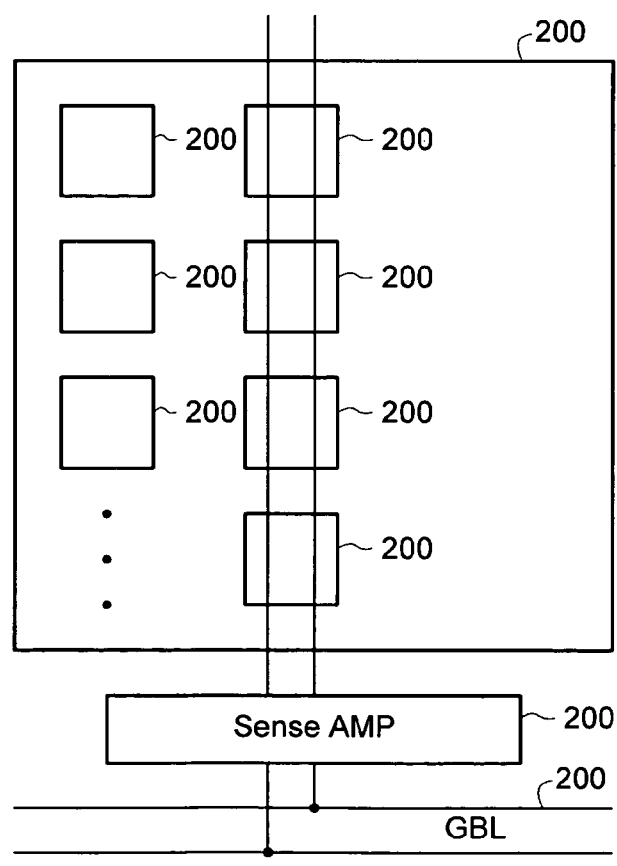
FIG. 2 (Prior Art) is an example of one embodiment of a circuit in which cells are each connected to a local bitline and wherein a plurality of local bitlines are coupled to a global bitline.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 3:
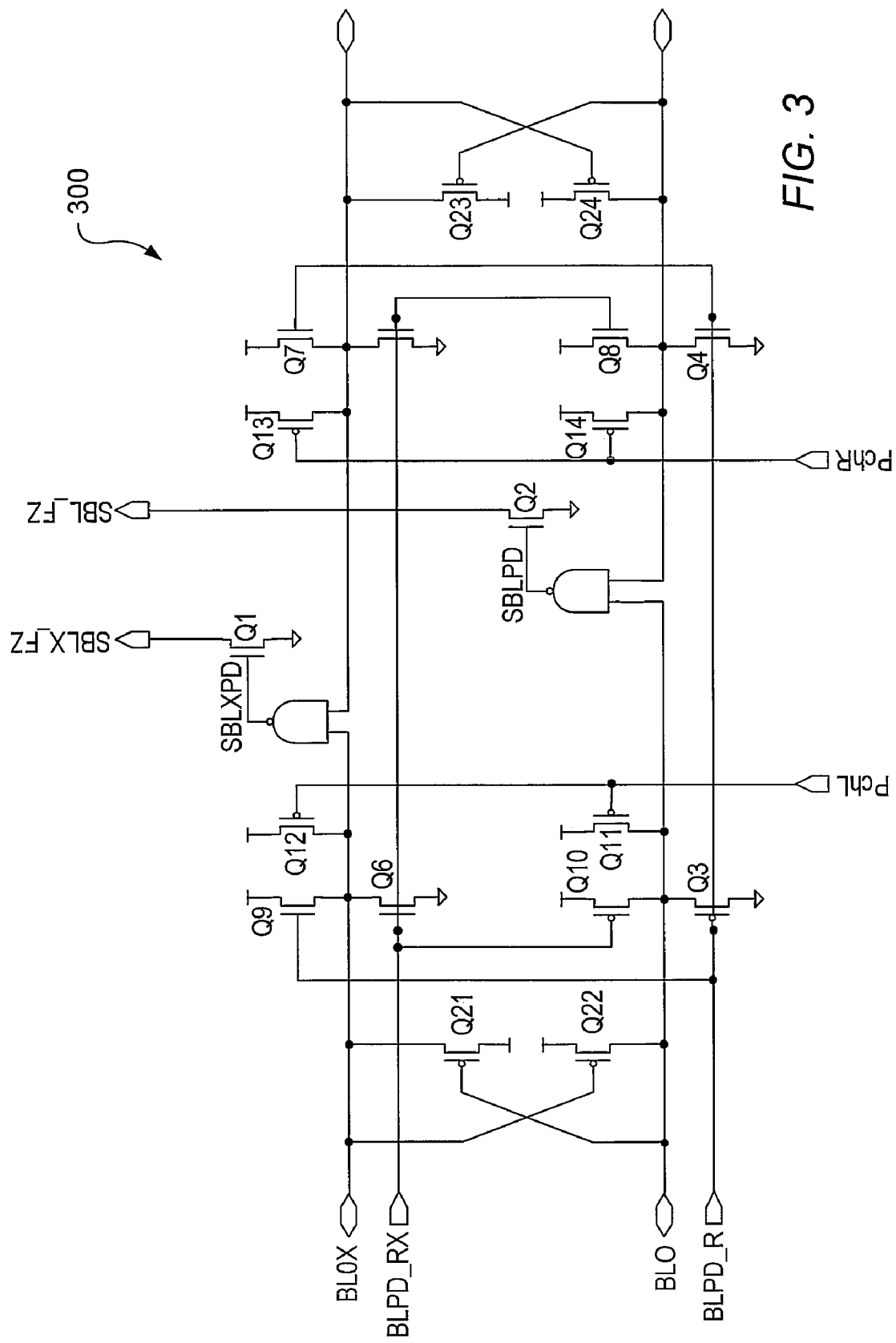
FIG. 3 is a schematic diagram of one embodiment of circuit for a memory array wherein the circuit includes local bitlines coupled to a global bitline.

Turning now to FIG. 3, a schematic diagram of one embodiment of circuit for a memory array wherein the circuit includes local bitlines coupled to a global bitline is shown. The circuit may be used in a memory circuit that uses a global bitline domino read/write scheme.

In the embodiment shown, circuit 300 includes a first differential local bitline pair (BL0, BL0X) and a second differential local bitline pair (BL1, BL1X). Each of the bitline pairs is coupled to a plurality of memory cells (not shown here). The local bitline pairs are each operatively coupled to a global (or super) bitline in domino scheme arrangement. In this particular example, each of the local bitlines are coupled to inputs of a NAND gate, with the NAND gate output coupled to the gate terminal of a transistor (n-channel in this case) which is coupled to pull down the global bitline when active. Both of BL0X and BL1X are coupled to one of the NAND gates, which in turn is operatively coupled to global bitline SBLX_FZ through transistor Q1. The complementary bitlines, BL0 and BL1 are coupled to the inputs of the other NAND gate, which is operatively coupled to global bitline SBL_FZ via transistor Q2. When one of the bitlines falls low, the NAND gate to which it is coupled will produce a logic high on its output and therefore turns on the transistor to which it is coupled. This results in the corresponding global bitline being pulled low. Since the circuit shown herein is a differential circuit, at least one of the global bitlines will be pulled low for any given cycle.

Each bitline pair is cross-coupled by a pair of transistors (p-channel transistors in this case). A first pair of transistors Q21 and Q22 is cross coupled between the bitline pair BL0 and BL0X, while a second pair transistors Q23 and Q24 is cross coupled between the bitline pair BL1 and BL1X. The cross coupled transistors aid in keeping the respective states on the complementary bitlines and help to prevent leakage currents. Leakage currents can cause memory cells to lose their data. This problem may be exacerbated for larger memory arrays and/or when more memory cells are coupled to each of the local bitline pairs. Since leakage current primarily affect the signal rail carrying a logic high signal, the cross coupled transistors may ensure that leakage currents do not cause the loss of data.

Circuit 300 also includes a pull circuit. In this particular embodiment, a pair of pull-down lines, BPLD_R and BPLD_RX are used to convey voltages to operate the pull circuits. BPLD_R is coupled to the gate terminals of transistors Q3, Q4, Q7 and Q9, and is thus configured, when carrying a logic high voltage, to pull down BL0 and BL1 while pulling up BL0X and BL1X. BLPD_RX is coupled to the gate terminals of transistors Q5, Q6, Q8 and Q10, and is thus configured, when carrying a logic high voltage, to pull down BL0X and BL1X while pulling up BL0 and BL1. These pull circuits may be used for write operations, writing a logic one onto one of the bitlines (thus allowing it to propagate to a target memory cell) while writing a logic 0 onto the complementary bitline.

Both differential local bitline pairs are coupled for precharge operations. In the embodiment shown, BL0 and BL0X are coupled to precharge transistors Q11 and Q12, respectively. Similarly, BL1 and BL1X are coupled to precharge transistors Q14 and Q13, respectively. When the PchL (precharge left) signal is low, transistors Q11 and Q12 are turned on, pulling both BL0 and BL0X high. When the PchR (precharge right) signal is low, transistors Q13 and Q14 are turned on, thereby pulling up both BL1 and BL1X. This precharge operation may be conducted prior to every read cycle, subsequent to a write cycle, or both. If in reading a cell a logic low is propagated onto a bitline, the bitline will convey the logic low to its coupled NAND gate and thereby propagate it onto the global bitline to which it is operatively coupled.

Figures 4A, 4B:
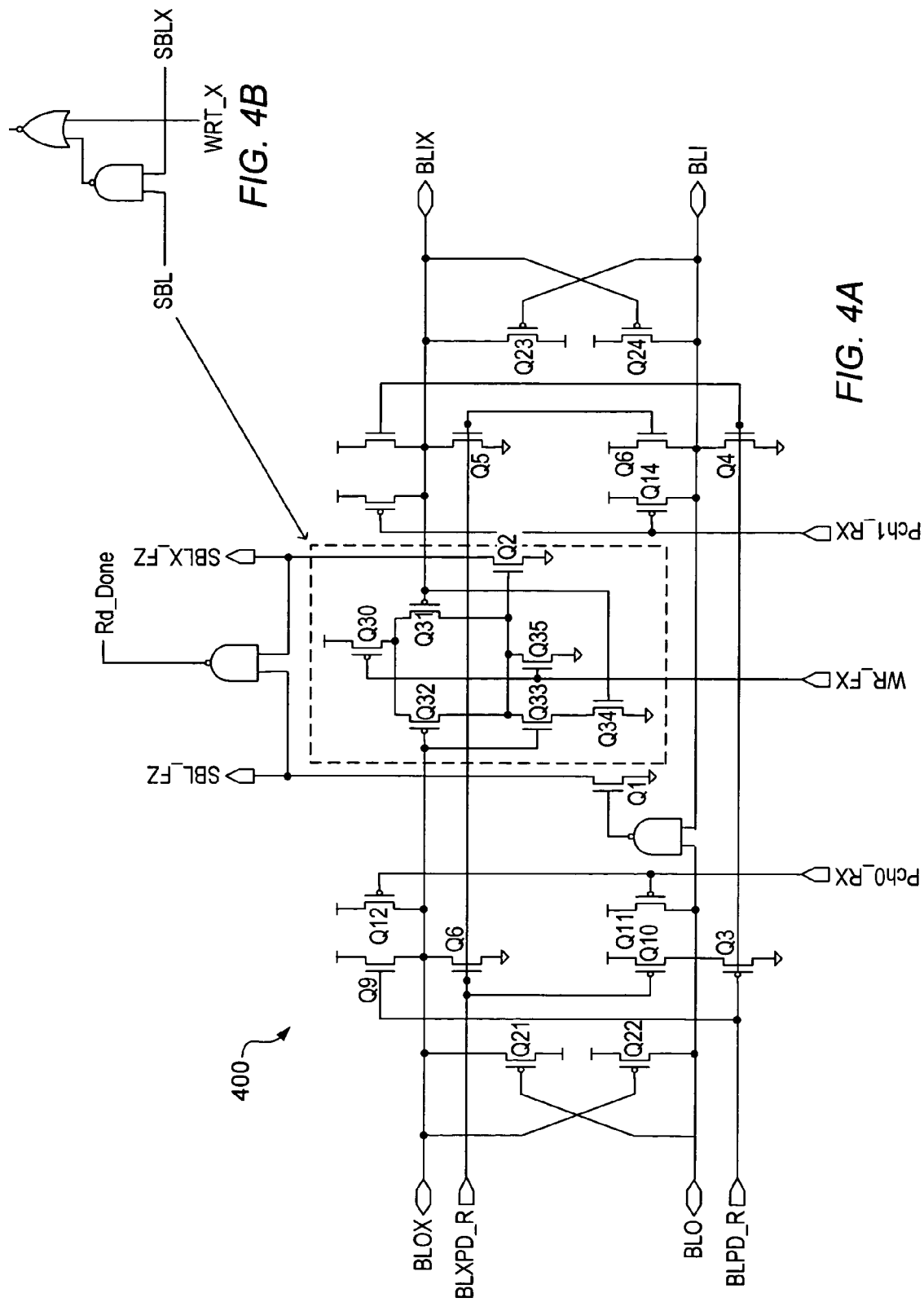
FIG. 4A is a schematic diagram of one embodiment of a circuit for a memory array wherein a complex gate is used to couple local bitlines to a global bitline.
FIG. 4B is a logic diagram illustrating one embodiment of the complex gate utilized in the embodiment of FIG. 4A.

FIG. 4A is a schematic diagram of one embodiment of a circuit for a memory array wherein a complex gate is used to couple local bitlines to a global bitline. The embodiment shown herein is similar in operation to the embodiment shown in FIG. 3. However, this particular embodiment implements a complex gate for coupling to one of global bitline (SBLX_FZ) of the global bitline pair. Logically, the complex gate implements an AND-OR-Invert function, as illustrated in FIG. 4B. The transistor level implementation of this circuit is shown in the area marked by the dashed lines.

The embodiment of the circuit shown in FIG. 4A may be used to prevent discharging the global bitline during single cycle read/precharge operations. By providing the signal Wr_FX as in input to the NOR gate, transistor Q35 is turned on, thereby pulling down the voltage on the gate terminal of transistor Q2. Thus, transistor Q2 is held in an off state, thus preventing the global bitline SBLX_FZ from being pulled low through transistor Q2. If the write signal is a logic low, transistor Q35 will be off, and thus the state of the global bitline SBLX_FZ is determined by the inputs to the AND gate, which are the BL0X and BL0X signal paths for the embodiment shown in FIG. 4A.

The embodiment of FIG. 4A is also useful in memory circuit wherein it is necessary to perform a read, a write, and a precharge all in a single cycle. In order to do all three of these operations in a single cycle, it is important to know when the read operation is complete. This may be easily accomplished by NANDing together the global bitlines SBL_FZ, as shown in the drawing. Since one of the global bitlines will fall low during as a result of a read operation, the output of the NAND gate will become a logic one, thereby indicating that a value read from one of the cells coupled to a local bitline has been read. This signal, provided as RD_DONE, may be conveyed to a control circuit (such as that discussed below in reference to FIG. 7) which may then allow the write operation to begin. Once the write is complete, the control circuit may issue a precharge command by driving the precharge lines low.

Figure 5:
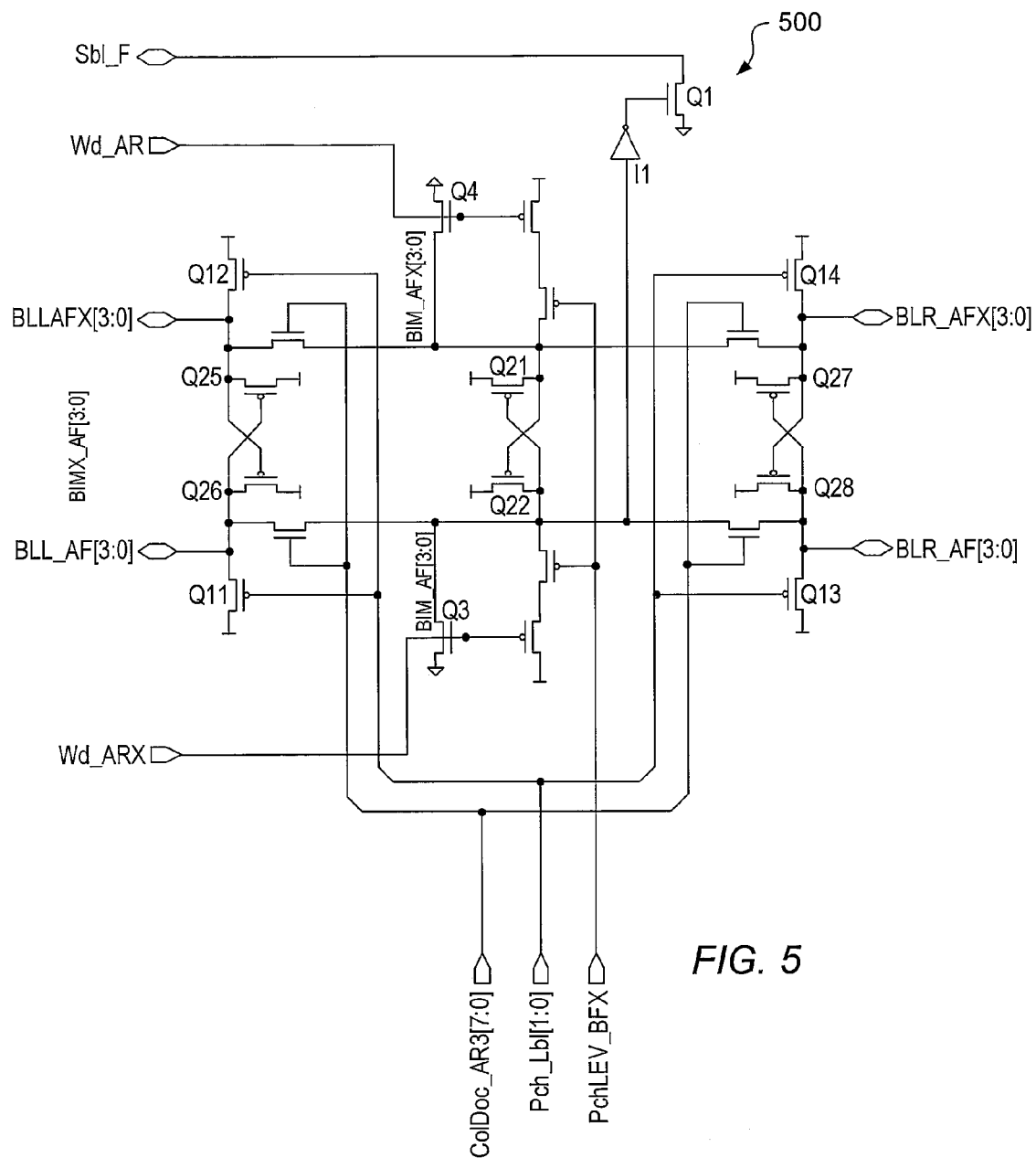
FIG. 5 is a schematic diagram of one embodiment of a circuit for a memory array wherein multiple local bitlines are coupled to a global bitline in a one-hot multiplexer arrangement.

FIG. 5 is a schematic diagram of one embodiment of a circuit for a memory array wherein multiple local bitlines are coupled to a global bitline in a one-hot multiplexer arrangement. A simplified version of the circuit is shown as well, although the local bitlines in the simplified version are single ended. However, the basic concept is easily extendible to embodiment implementing local bitlines ad differential pairs. In general, the embodiment shown in FIG. 5 may be area efficient with respect to other types of circuits of this kind, and thus is useful in applications where area savings are a high priority.

In the embodiment shown, circuit 500 includes a plurality of local bitlines BLL_AFX [3:0], BLL_AF [3:0], BLR_AFX [3:0], BLR_AF [3:0]) each coupled to an intermediate bitline in a one-hot multiplexer arrangement. Only one set of the bitlines on each of the left half and right half of the circuit are selectively coupled to the intermediate bitlines (BIM_AF, BIM_AFX) at a given time by activating their respective pass-gate transistor. The other ones of the local bitlines remain isolated from the intermediate bitline as long as their respective passgate transistor is not activated.

A control circuit is coupled to provide column decode signals for selecting the various ones of the pass-gate transistors.

Both local bitlines and intermediate bitlines are cross-coupled by a pair of transistors, similar to the embodiments discussed above. Transistors Q27 and Q28 are cross coupled between bitlines BLR_AFX [3:0] and BLR_AF [3:0], while transistors Q25 and Q26 are cross coupled between bitlines BLL_AFX [3:0] and BLL_AF [3:0]. Transistors Q21 and Q22 are cross coupled between the intermediate bitlines BIM_AF and BIM_AFX. This embodiment also employs pull-down circuitry through the signal lines Wd_AR and Wd_ARX. In order to pull down a local bitline, the bitline must be pulled down through a stack of three devices (i.e. a '3-stack') including the bitcell itself, the passgate of the one-hot multiplexer, and the pulldown transistor having its gate coupled to the write done signal (conveyed differentially on Wd_AR and Wd_ARX), Q3 and Q4 in this embodiment.

Precharge operations may be conducted on all of the local bitlines at the same time. These operations are conducted by activating transistors Q11 and Q12 for the left half of the circuit, and transistors Q13 and Q14 for the right half of the circuit.

Circuit 500 is configured to provide an output to a single ended global bitline. The intermediate bitline to which the global bitline is operatively coupled is configured to convey the true value of a memory cell, while the other intermediate bitline conveys the complement of the memory cell value. The true logic value conveyed on the true intermediate bitline is conveyed to inverter I1. If the logic value conveyed on the true intermediate bitline is a logic 1, transistor Q1 is held in it off state, and thus a logic 1 is retained on the global bitline, since the global bitline is also subject to precharging. If the logic value conveyed on the intermediate bitline is a logic low, transistor Q1 is turned on subject to the inversion provided by I1, and thereby pulls the global bitline low.

Figure 6:
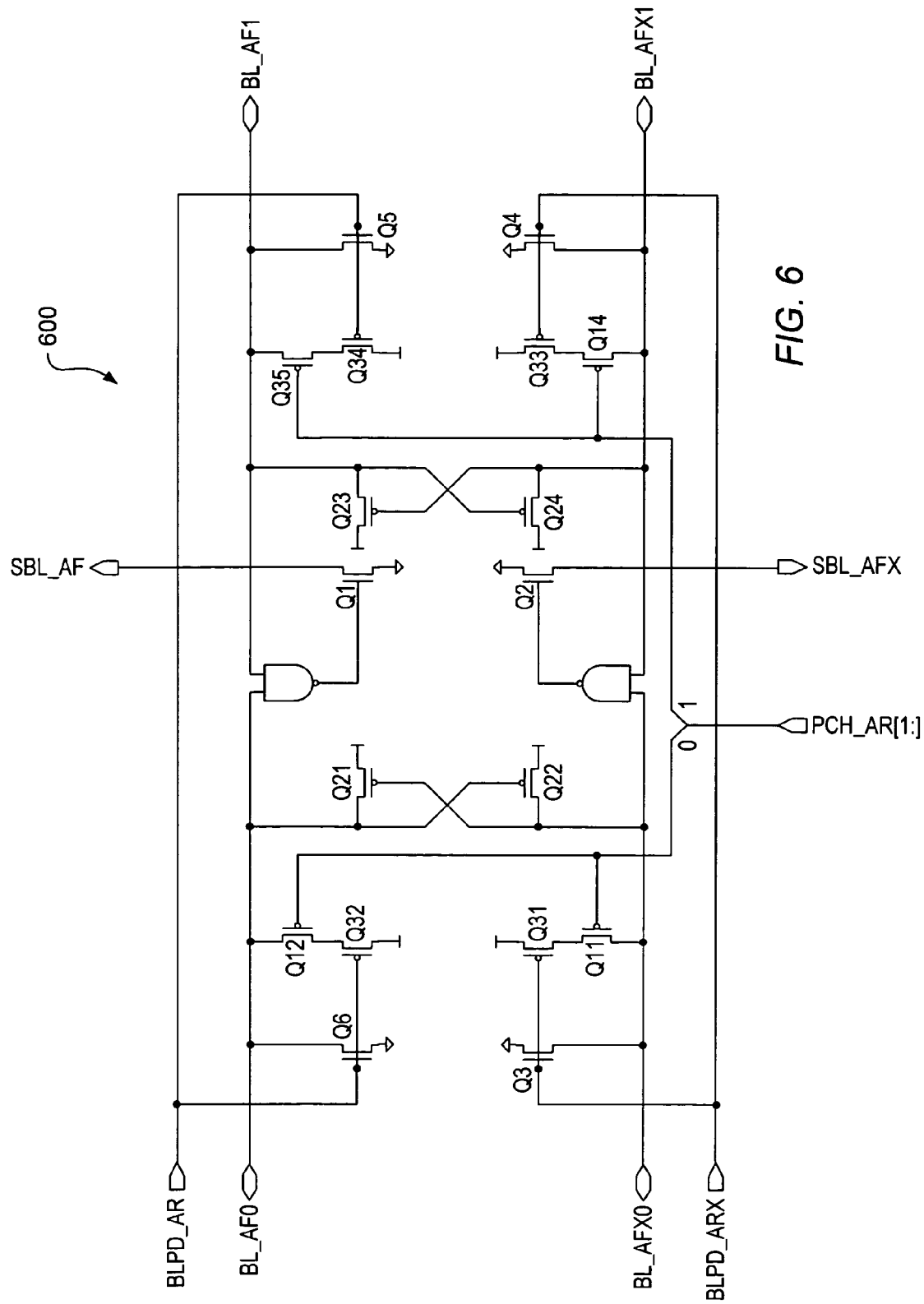
FIG. 6 is a schematic diagram of one embodiment of a circuit for a memory array wherein pre-charging is performed during the opposite phase of the clock cycle with respect to reads and writes.

FIG. 6 is a schematic diagram of one embodiment of a circuit for a memory array wherein pre-charging is performed during the opposite phase of the clock cycle with respect to reads and writes. Circuit 600 is configured in a manner similar to circuits 300 and 400 discussed above. However, circuit 600 is configured to read, write, and precharge in a read—precharge—write—precharge pattern in synchronization with a clock signal provided to a control unit coupled thereto. The read and write operations occur during alternating high portions of the clock cycle, while the precharge operations are performed during the low portion of the clock cycle. The ability to perform this function is enabled by the use of a 2-device stack for the precharge operation. When the clock is in the low portion of its cycle, the bitline pulldowns BIPD_AR and BIPD_ARX are low, thereby activating transistors Q31, Q32, Q33 and Q34. Thus, when the precharge transistors are activated on the low clock cycle, each bitline is pulled high through a precharge transistor (e.g. Q12) and a pullup transistor (e.g. Q32) which is coupled to a pulldown line. Since the circuit is operated in such a manner that the precharge transistors are activated only when the clock is low, crowbar currents (e.g. through Q36, Q12, and Q6) may be avoided. Therefore, if write and precharge operations (or read and precharge operations) inadvertently overlap (such as during the transition of a clock signal between a high state and a low state), crowbar currents are still avoided.

Figure 7:
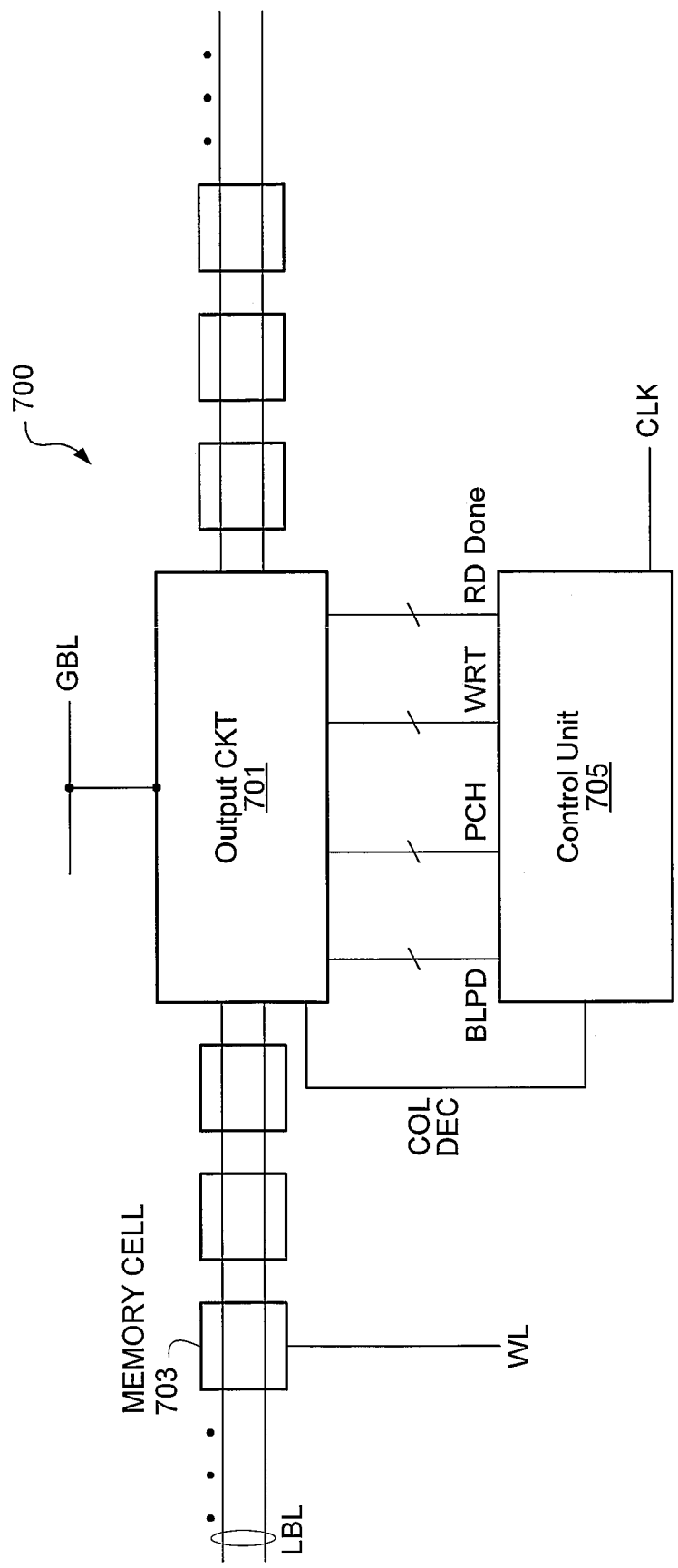
FIG. 7 is a block diagram of one embodiment of a memory subsystem includig a memory control circuit and a memory array.

FIG. 7 is a block diagram of one embodiment of a memory subsystem including a memory control circuit and a memory array. In the embodiment shown, memory subsystem includes a plurality of memory cells 703, each coupled to a local bitline (which is a differential bitline in this case, but may also be single ended). The memory cells shown may be a portion of a large group of memory cells coupled to other bitlines that are not shown here. Each of the bitlines is coupled to an output circuit 701. Output circuit 701 may be one of the various types of circuits discussed above in reference to FIG. 3-FIG. 6, and may provide an output from the coupled memory cells via a global bitline. The global bitline shown here is single ended, although as noted by the previously discussed embodiments, differential global bitlines are also possible.

Memory subsystem 700 includes a control unit 705 coupled to output circuit 701. This control unit may be coupled to a plurality of output circuits 701, although only one is shown here for the sake of simplicity. Control unit is coupled to receive a clock signal for synchronizing memory operations, and is further coupled to provide various control signals to output circuit 701. The particular control signal provided to output circuit are dependent on the specific embodiment implemented, although these signals typically include precharge (PCH) and bitline pulldown (BLPD) signals. Other control signals may include the write (WRT) signal (for embodiments such as the one of FIG. 4) and the column decode (ColDec) signal (for one-hot multiplexer embodiments such as the one in FIG. 5). The control unit may also be coupled to receive a read done (RD Done) signal from embodiments such as the one shown in FIG. 4. Control unit 705 may perform operations such as initiating precharge operations, writing data to cells (through the use of the pulldown lines) and initiating reads of data from cells, and any other control functions that may be required.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A memory circuit comprising:
   a plurality of cells, wherein each of the cells is configured to store a bit of data;
   a plurality of local bitlines, wherein each of the plurality of cells is coupled to one of the plurality of local bitlines, wherein each of the plurality of local bitlines is a differential bitline having a signal path and a complementary signal path, wherein the signal path and the complementary signal path of each of the plurality of local bitlines are cross-coupled by a pair of transistors, and wherein each of the plurality of cells is coupled to one of the plurality of local bitlines; and
   a pull circuit, wherein the pull circuit is configured to, in a first state, pull up the signal path and pull down the complementary signal path, and wherein in a second state, the pull circuit is configured to pull down the signal path and pull up the complementary signal path, wherein the pull circuit includes:
   a first pulldown line operatively coupled to the signal path and the complementary signal path, wherein the first pulldown line, when activated, is configured to cause the complementary signal path to be pulled down to a reference voltage and the signal path to be pulled up to a logic voltage; and
   a second pulldown line operatively coupled signal path an the complementary signal path, wherein the second pulldown line, when activated, is configured to cause the signal path to be pulled down to a reference voltage and the complementary signal path to be pulled up to a logic voltage.

2. The memory circuit as recited in claim 1, wherein the memory circuit further includes a first precharge line and a second precharge line, wherein the first precharge line, when energized, causes a first one of the plurality of local bitlines to be charged to a logic high voltage, and wherein the second precharge line, when energized, causes a second one of the plurality of local bitlines to be charged to a logic high voltage.

3. The memory circuit as recited in claim 2, wherein the memory circuit is configured such that a precharge is performed upon completion of a write cycle.

4. The memory circuit as recited in claim 2, wherein the memory circuit is configured such that a read operation, a write operation, and a precharge operation are all completed in a single memory cycle.

5. The memory circuit as recited in claim 4, wherein the memory circuit includes a NAND gate coupled to receive a global bitline input and a complementary global bitline input, and wherein the NAND gate is configured to assert a signal indicating completion of the read operation when one of the global bitline input and the complementary global bitline input falls to a logic low voltage.

6. The memory circuit as recited in claim 2, wherein the memory circuit is configured such that a read and precharge operations are completed within a first memory cycle and wherein write and precharge operations are completed within a second memory cycle.

7. The memory circuit as recited in claim 2, wherein the circuit is configured to perform read and write operations during a high portion of a clock cycle and precharge operations during a low portion of a clock cycle, and wherein the circuit is configured such that crowbar currents are avoided even if write and precharge operations overlap.

8. The memory circuit as recited in claim 1, wherein the memory circuit includes an intermediate bitline operatively coupled to each of the plurality of local bitlines in a one-hot multiplexer arrangement.

9. The memory circuit as recited in claim 8, wherein the intermediate bitline is operatively coupled to a global bitline, wherein the global bitline is a single ended bitline.

10. The memory circuit as recited in claim 1, wherein each of the plurality of local bitlines is operatively coupled to a global bitline, wherein the global bitline is a differential bitline having a global bitline signal path and a complementary global bitline signal path.

* * * * *